United States Patent [19]

Glincman

[11] Patent Number: 4,617,550
[45] Date of Patent: Oct. 14, 1986

[54] ANALOG-TO-DIGITAL CONVERTERS WITH VIRTUAL INTEGRATION

[75] Inventor: Mandel Glincman, Hillsborough Township, Somerset County, N.J.

[73] Assignee: RCA Corporation, Princeton, N.J.

[21] Appl. No.: 613,415

[22] Filed: May 24, 1984

[51] Int. Cl.[4] .............................................. H03M 1/06
[52] U.S. Cl. ...................... 340/347 AD; 340/347 NT
[58] Field of Search .................. 340/347 NT, 347 AD

[56] References Cited

U.S. PATENT DOCUMENTS

| Re. 28,833 | 5/1976 | Dorey | 340/347 NT |
|---|---|---|---|
| 3,942,172 | 3/1976 | Tucker | 340/347 NT |
| 4,164,733 | 8/1979 | Landsburg et al. | 340/347 NT |
| 4,357,600 | 11/1982 | Ressmeyer et al. | 340/347 NT |

Primary Examiner—L. T. Hix
Assistant Examiner—David M. Gray
Attorney, Agent, or Firm—Joseph S. Tripoli; Henry I. Schanzer

[57] ABSTRACT

A dual-slope analog-to-digital converter includes an integrator whose output may be driven from an initial zero voltage level to a value outside the linear region of the integrator in response to an input signal $V_X$ of unknown amplitude applied for a fixed integrating period $T_S$. The output of the integrator is sensed and whenever the output voltage exceeds a preset limit a reference potential is applied to the integrator input, while the input signal is applied, to reduce its output below the preset limit. The time intervals the reference potential is applied during the period $T_S$ are measured and stored. Following the period $T_S$ the reference potential is applied until the integrator output is returned to the initial threshold level. The total time the reference potential is applied during the sampling period and after $T_S$ is accumulated enabling the determination of the value of $V_X$.

10 Claims, 4 Drawing Figures

ANALOG-TO-DIGITAL CONVERTERS WITH VIRTUAL INTEGRATION

This invention relates to analog-to-digital (A/D) converters and, in particular, to A/D converters of the dual slope integrating type.

Typically, in known A/D converters of the dual slope integrating type, an input signal $V_X$ of unknown amplitude is applied to the input of an integrator causing the voltage (Vo) at the output of the integrator to ramp up (or down) from a threshold level, e.g. zero volts, for a known signal sampling (or integrating) period ($T_S$) such that Vo is proportional to $V_X \cdot T_S$. The input signal is then removed and a reference voltage ($V_R$) of known amplitude and of opposite polarity to that of the input signal is applied to the input of the integrator until its output is ramped down (or up) for a measured period, $T_R$, until Vo again equals the value of the threshold level. The ratio of $V_X$ to $V_R$ is equal to the ratio of the period, $T_R$, during which the reference voltage is applied to the period $T_S$ during which the input signal $V_X$ is applied. Since $T_S$ and $V_R$ are known, and since $T_R$ is measured, and hence known, the amplitude $V_X$ of the input signal may be obtained.

In the discussion to follow, it is assumed that the integrator output ramps up (i.e. its output goes positive with respect to ground) during the signal integration period and that its output ramps down (i.e. its output goes negative towards ground potential) during the application of the reference potential. However it should be understood that the inverse could occur as well. That is, if an input signal were applied to cause the integrator output to ramp down, a reference potential would then be applied to cause the integrator output to ramp up.

A disadvantage of known dual slope converters is that their integrating range is limited by the value of the operating voltage applied to the integrator and/or by the value of the voltage which the components of the integrator can sustain. Typically, integrated circuit (IC) components can be operated with voltages of ±15 volts. To assure operation in the linear region and to prevent saturation the output of the integrator should, typically, not be driven beyond ±10 volts.

This presents a significant problem where it is desired to sense input signals which may cause the output of the integrator to exceed its linear range (±10 volts) and possibly its operating voltage range (e.g. ±15 volts) as well.

This problem is overcome in circuits embodying the invention by sensing the voltage at the output of the integrator during the signal integrating time. Whenever the integrator's output voltage tends to go beyond a preset limit, a reference potential, having a polarity opposite that of the input signal, is applied to the integrator input, simultaneously with the input signal, for reducing the integrator output voltage. Thus, in circuits embodying the invention the input signal is continuously applied to the integrator during a signal sampling period $T_S$ and the reference potential is selectively injected in order to maintain the output of the integrator within a predetermined optimum voltage range. The length of time (ti) the reference potential is applied during the $T_S$ period is recorded. Following the period $T_S$, the reference potential is always applied for a final period ($T_f$) until the integrator output is restored to its initial threshold condition (e.g. 0 volt). The final period $T_f$ is added to any intermediate time period (ti) to obtain the total period $T_R$ for which the reference potential was applied.

In the accompanying drawings, like reference characters denote like components, and FIG. 1 is a block diagram of a system embodying the invention;

Figure 1:
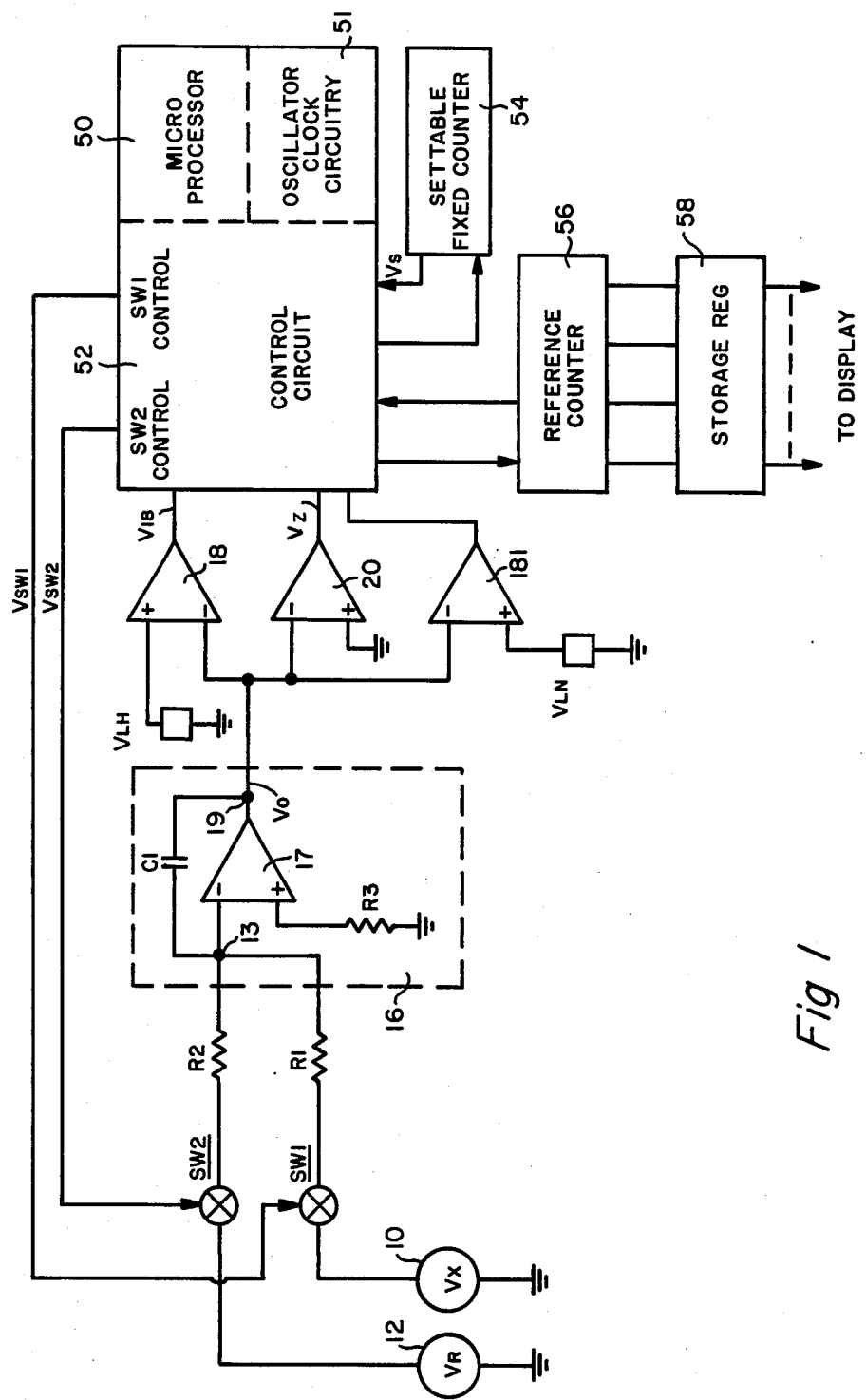

In the circuit of FIG. 1, a source 10 of input signal $V_X$ which produces an analog voltage of unknown amplitude is coupled via a controllable switch SW1 to one end of a resistor R1 whose other end is connected to a node 13 which is connected to the inverting input node of an integrator 16. Although the polarity of the input signal may be either positive or negative, it is assumed, for ease of the explanation to follow, that the polarity of $V_X$ is such that when $V_X$ is connected in circuit (i.e. switch SW1 is closed), the voltage Vo at the output of integrator 16 tends to ramp up from a threshold or reference level of zero volts.

A source 12 of reference voltage $V_R$ of known amplitude and having a polarity selected (by means not shown) to be opposite that of the input signal $V_X$, is applied via a controllable switch SW2 to one end of a resistor R2 whose other end is connected to node 13. The amplitude of $V_R$ and its corresponding reference current ($I_R = V_R/R2$) is equal to, or greater, than the maximum specified input signal $V_X$ and its corresponding current $I_X$ (i.e. $V_X/R1$).

Integrator 16 includes a high gain differential input operational amplifier 17 whose negative input is connected to node 13, whose positive input is returned via a resistor R3 to ground, and which has an integrating capacitor C1 connected between its output node 19 and its input node 13.

The voltage at node 13, as is known in the art, is maintained at virtual ground potential by use of negative feedback between the output and input of amplifier 17. Thus, the signal current ($V_X/R1$) is unaffected by the insertion or removal of the reference current ($V_R/R2$) and/or by the presence of the feedback current (Vo/C1) also applied to node 13. A negative $V_X$ (or $V_R$) causes a current to flow out of node 13 which in turn causes the plate of C1 connected to node 13 to discharge (charge negatively) and the output voltage (Vo) of the integrator to ramp up positively. Conversely, a positive $V_X$ (or $V_R$) causes a current to flow into node 13 causing Vo to ramp down negatively.

The output of integrator 16 is applied to the negative inputs of a positive limit comparator 18 and a zero crossover comparator 20. A high positive limit voltage ($V_{LH}$) is applied to the positive input of limit comparator 18. $V_{LH}$ may be derived from $V_R$ or from some other known potential source and has the same polarity as $V_R$. Whenever Vo reaches the value of $V_{LH}$, the limit comparator 18 produces a signal (V18) at its output which is applied to a control circuit 52. Limit comparator 18 is used to sense when the output of the integrator as it is being ramped positively with respect to ground reaches a predetermined level (e.g., $V_{LH}$) above which the integrator would either shortly go into saturation or no longer operate in an optimum range.

Control circuit 52 is part of a microprocessor 50 which includes oscillator and clock circuitry 51. The oscillator and clock circuitry 51 functions as the time base of the system and produces the clock pulses counted by counters 54 and 56 and which are used to set and/or to determine the time intervals.

A settable fixed counter 54, connected to circuit 52, is used to count out a preset integrating period of duration $T_S$. Prior to the beginning of each signal integration period, fixed counter 54 is first reset to zero. With the onset of each integrating period it counts pulses produced by clock 51 until a predetermined integration period ($T_S$) is reached. When $T_S$ is reached, counter 54 produces a signal $V_S$ which is applied to control circuit 52. In response to the signal $V_S$, control circuit 52 produces a signal which opens up switch SW1 and disconnects $V_X$ from the circuit. Simultaneously, $V_S$ causes control circuit 52 to produce a signal closing switch SW2 and connecting $V_R$ into the circuit. When $V_R$ is thus connected into the circuit, it is applied until Vo is driven to zero.

A reference counter 56 is connected to circuit 52 to count and store the total period that the reference voltage ($V_R$) is applied to the integrator 16. In the circuit of FIG. 1, counter 56 is programmed to have two modes of operation. During the integration period $T_S$, counter 56, when selected by control circuit 52, is programmed to count fixed sub-intervals, each interval being of 100 counts, during which the reference voltage ($V_R$) is applied to the integrator. The total number of counts (or time)—i.e. the total number of sub-intervals—that $V_R$ is applied to the integrator during the sampling period $T_S$ is summed and stored in counter 56. Following the $T_S$ period, $V_R$ is applied to the integrator and counter 56 is used to count the time ($T_f$) it takes the output of the integrator to ramp down (or up) to zero. The time $T_f$ is added to the sub-interval period(s) previously summed and stored during the sampling period to produce the total period $T_R$ during which $V_R$ was applied. The output of counter 56 is then selectively read out to a storage register 58 whose output is applied to a display (not shown).

During the sampling period (between $t=0$ and $t=T_S$) the output (Vo) of integrator 16 may increase to a value which exceeds $V_{LH}$. Whenever that happens, limit comparator 18 produces a trigger signal (V18) which it applies to control circuit 52 indicating that Vo has exceeded $V_{LH}$. Circuit 52 then produces a signal VSW2, applied to switch SW2, which closes SW2 coupling reference voltage source 12 to integrator 16 and, concurrently, enables reference counter 56 designed to count the length of time $V_R$ is applied.

When the sampling period ends at time $T_S$, $V_X$ is removed from the circuit and only $V_R$ is applied causing Vo to ramp down from some positive voltage to ground. Zero crossover comparator 20 senses the point, at which Vo reaches zero volts as Vo is being ramped down (or up) from some positive (or negative) voltage relative to ground. As soon as Vo reaches zero volts, comparator 20 produces a signal $V_Z$ at its output which is applied to control circuit 52. In response to the $V_Z$ signal indicating that Vo has reached zero volts, circuit 52 stops reference counter 56 and initiates the display of the contents of counter 56 via storage register 58 to a display (not shown). The storage register is calibrated to ensure that the signals provided to the display cause the value of $V_X$ to be given directly.

Figure 2:
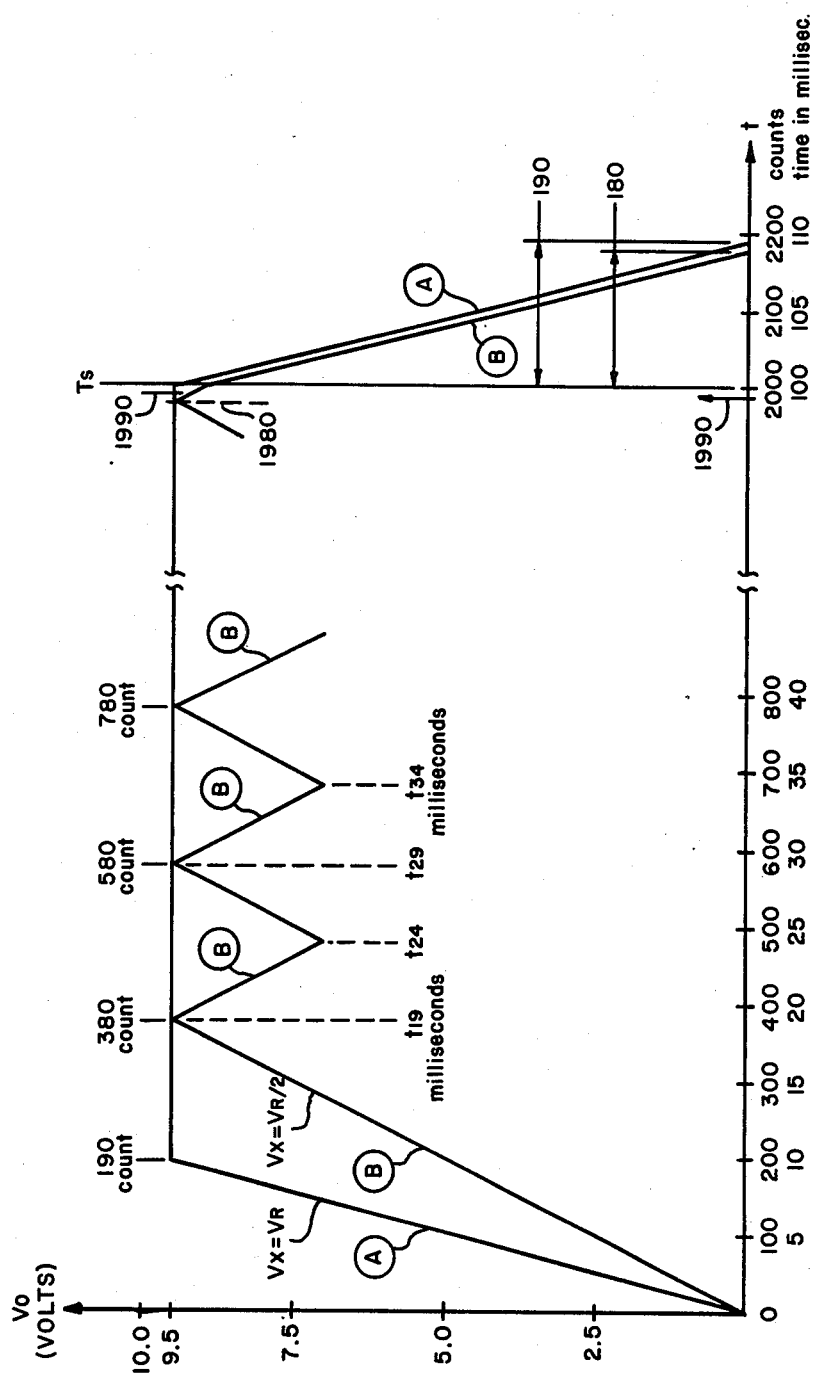
FIG. 2 is a waveform diagram for explaining the operation of the circuit of FIG. 1.

The operation of the circuit of FIG. 1 is best understood with reference to FIG. 2.

In response to a start control signal from microprocessor 50, circuit 52 produces a VSW1 signal which causes switch SW1 to close and $V_X$ to be applied via R1 to node 13. Simultaneously, fixed counter 54 starts to count from zero for a signal integration period $T_S$. Assume for example, that $T_S$ is equal to 100 milliseconds, which is produced by counting 2,000 pulses with each pulse having a period of 50 microseconds. Thus in the discussion to follow, it is assumed that each count represents a period of 50 microseconds.

Assume, also, that: (a) $V_X$ is of a polarity to cause the output Vo of integrator 16 to ramp up from a threshold level of zero volts; (b) $V_R$ and the maximum specified value of $V_X$ which may be applied to the systems is 2 volts; (c) the application of a voltage $V_X$ (or $V_R$) of 2 volts causes a virtual voltage ($V_V$) of 100 volts to be produced at the output of integrator 16 in 2000 counts (where each count corresponds to a period of 50 microseconds); (d) the operating potentials applied to amplifier 17 of integrator 16 are +15 volts, −15 volts and ground, whereby the output of integrator 16 can typically go from zero volts to ±10 volts before saturating; (e) the high positive limit voltage, $V_{LH}$, applied to comparator 18, is set equal to 9.5 volts, whereby when Vo is equal to 9.5 volts, comparator 18 produces a trigger signal which is applied to control circuit 52; (f) when circuit 52 is so triggered, it generates a signal VSW2 of a polarity and magnitude to close switch SW2 and apply $V_R$ via R2 to node 13; and, concurrently, starts reference counter 56 counting the length of time $V_R$ is applied; (g) each time $V_R$ is applied while the $T_S$ period is extent, it is applied for a fixed sub-interval of 100 counts. The length of time (e.g. 100 counts) selected for the sub-interval is somewhat arbitrary. The maximum sub-interval period must be less than the time it takes for Vo to ramp down from $V_{LH}$ to ground. The minimum sub-interval could be one count wide. But such a short interval would require extremely frequent switching of $V_R$ into and out of the circuit.

As shown in waveform A of FIG. 2, if a $V_X$ of 2 volts is applied to the system, a voltage Vo of 9.5 volts is reached after 9.5 milliseconds (i.e. 190 counts). As soon as Vo reaches 9.5 volts, limit comparator 18 produces a trigger signal indicating that the limit voltage is being exceeded. On the next clock pulse, (i.e. pulse 191), a $V_R$ of 2 volts is applied via R2 to node 13 for 100 counts (i.e. 5 milliseconds) which are counted by and stored in reference counter 56.

Since $V_R$ is equal in amplitude, but is of opposite polarity, to $V_X$ the net current ($I_X - I_R$) is equal to zero and Vo remains at 9.5 volts. At the end of the first sub-interval of 100 counts (i.e., count 290) Vo is still at, or above, $V_{LH}$. The output of comparator 18 indicates that Vo is still at, or above, 9.5 volts and $V_R$ remains applied for another sub-interval of 100 counts. This second set of 100 counts is counted and accumulated in counter 56 in addition to the previous count(s). With $V_X = V_R$, at the end of count 390, and at the end of each subsequent sub-interval, Vo will still be above $V_L$ and V18 will provide trigger signals to control circuit 52 maintaining $V_R$ applied and counter 56 counting and accumulating all previous counts. Thus, for $V_X$ equal to $V_R$, $V_R$ once applied remains continuously applied until time $T_S$ is reached on the 2000th count (i.e. at end of 100 milliseconds).

Note that at the 1990th count (ten counts prior to $T_S$) $V_R$ was again programmed to be applied to the integrator for a sub-interval of 100 counts. However when $T_S$ is reached, fixed counter 54 provides a signal $V_S$ which causes switch SW1 to be opened disconnecting the input signal source from the circuit. Concurrently, switch SW2, if not already closed, is closed to apply $V_R$ to the circuit until Vo goes to zero volts. Also, concurrently, counter 56, if not already counting, is set to count the elapsed time between $T_S$ and the time $T_S+T_f$ when Vo crosses the zero axis. Since at time $T_S$, Vo is at 9.5 volts and since $V_R$ is equal to 2 volts and since Vo is discharged at the rate of 0.05 volt/count, it will take 4.5 milliseconds (190 counts) for Vo to be discharged from 9.5 volts to zero volts after $T_S$. The total count accumulated in reference counter 56 is then 2,000 counts indicating that $V_X$ is equal to 2 volts.

The point in time at which Vo is ramped down to zero volts (the zero cross over point) is detected by means of zero cross over detector 20. It is important to note that due to the virtual integration method the output voltage Vo changes by 50 millivolts per volt of signal during each 50 microsecond interval. It is relatively easy for standard comparators to sense such a relatively large change in voltage and to produce an accurate indication of when Vo crossed the zero voltage axis.

Assume now that an analog input signal $V_X$ of 1 volt, (i.e. $V_R/2$) is applied to the system as shown in waveform B of FIG. 2. Assume, as before, that: (a) switch SW1 is closed at time $t_o$ and that $V_X$ is applied via SW1 to integrator 16; (b) counters 54 and 56 are reset to zero prior to time $t_o$; (c) fixed counter 54, begins counting at time $t_o$ until it reaches a preset count ($T_S$) of 100 milliseconds (i.e. 2000 counts); (d) the system is calibrated such that a $V_R$ or $V_X$ of 2 volts produces a virtual voltage of 100 volts in 2,000 counts. Hence, a $V_X$ of 1 volt causes Vo to reach 9.5 volts after 380 counts or 19 milliseconds (i.e. $t_{19}$).

When Vo reaches 9.5 v, comparator 18 provides a signal to control circuit 52, which, on the next count (i.e. count 381) produces a signal VSW2 causing switch SW2 to close and the application of $V_R$ via R2 to node 13 for a sub-interval of 100 counts. Beginning with the count immediately after time $t_{19}$ (corresponding to the 380th count), $V_X$ and $V_R$ are applied to integrator 16 and the difference in the current produced by $V_X$ and $V_R$ is integrated by integrator 16. Since $V_R$ is twice the value of $V_X$, the Vo is ramped down during the succeeding 100 count sub-interval. For the assumed values, Vo decreases from 9.5 volts at time $t_{19}$ to 7.0 volts at time $t_{24}$ (which occurs at count 480). At time $t_{24}$, Vo is below 9.5 volts. This condition is sensed by comparator 18 whose output applied to indicates that Vo is below $V_L$. In response thereto, control circuit 52 produces a signal which opens switch SW2 discontinuing the application of $V_R$ to integrator 16, and prevents the further application of counting pulses to reference counter 56 which is programmed to store the 100 counts previously counted.

At time $t_{24}$, with $V_R$ removed from the circuit and only $V_X$ applied, Vo again begins to ramp up from 7.0 volts until the 9.5 volt limit voltage is exceeded. Since $V_X$ is equal to 1 volt it will reach 9.5 volts at time $t_{29}$ corresponding to the 580th count. On the next clock pulse, after the 580th count, switch SW2 is closed whereby $V_R$ is again applied to integrator 16 and counter 56 begins counting and accumulating another 100 counts. Counter 56 will count an additional sub-interval of 100 counts while Vo is again ramped down until the 680th count corresponding to $t_{34}$. The insertion and removal of $V_R$ is repeated as often as is necessary until the termination of the signal integration period $T_S$. As shown in waveform B of FIG. 2, Vo reaches 9.5 v at the time (i.e. 99 milliseconds) corresponding to the 1,980th pulse. During a 20 count interval, from $t=99$ milliseconds until the 2,000th count when $t=T_S$ is equal to 100 milliseconds, $V_R$ and $V_X$ are simultaneously being applied and Vo discharges at the rate of 0.025 volt/count. Hence, at time $T_S$, Vo will equal 9 volts. When $T_S$ is reached, at the 2,000th count, switch SW1 is open and $V_X$ is removed from the circuit. At that point, since $V_R$ is already connected in circuit, it remains connected in circuit until Vo is discharged to zero volts. Since $V_X$ is no longer present beginning with $T_S=2000$, Vo discharges at the rate of 0.05 v/count. Since Vo is 9.0 volts at $T_S=2000$, it will discharge to ground in 180 counts. At time $T_S$ and $T_f$ a total of 1000 counts will have been stored in counter 56. This indicates that $V_R$ had to be applied for 1000 counts to restore Vo to zero volts. Applying $V_R$ for 1000 counts indicates that $V_X$ was equal to $\frac{1}{2}$ $V_R$ or 1.000 volts.

The circuit of the invention provides some significant advantages. As is evident from the above discussion, the input signal $V_X$ is applied continuously during the sampling period. This provides a significant benefit in that the filtering action resulting from integrating is not chopped up or interrupted.

This allows the filtering out of major AC noise sources such as 60 Hz, 50 Hz, or 400 Hz, hum. The benefit of applying the reference voltage at the same time as the unknown voltage also reduces the total integrating time significantly. Although the sampling or integration period, $T_S$, is the same as in the prior art "deintegration" during the sampling period enables the total time ($T_S+T_f$) needed to determine the value of $V_X$ to be reduced considerably. Another benefit is that the effective signal to noise ratio is much higher than in prior art circuits due to the virtual integration of the signal. Also as noted above working with high voltages allows a much more accurate determination of the cross over point.

In the description above, it was assumed that $V_X$ was of a polarity to cause Vo to ramp up. $V_X$ can in fact be of a polarity to cause Vo to ramp down. Accordingly, there is shown in FIG. 1 a comparator 181 which would be used to sense when Vo is ramped negatively and when the negative ramp reaches or exceeds a limit $V_{LN}$ of, for example, $-9.5$ volts. The output of comparator 181 would be used to control the insertion and removal of $V_R$ in a similar manner to that described above whenever Vo tended to go more negative than $-9.5$ volts. Note that the outputs of comparators 18 and 181, or even the output of comparator 20, may be used to sense the polarity of Vo and the outputs of these comparators may then be used to select the polarity of $V_R$ applied to the circuit when SW2 is closed.

Figure 3:
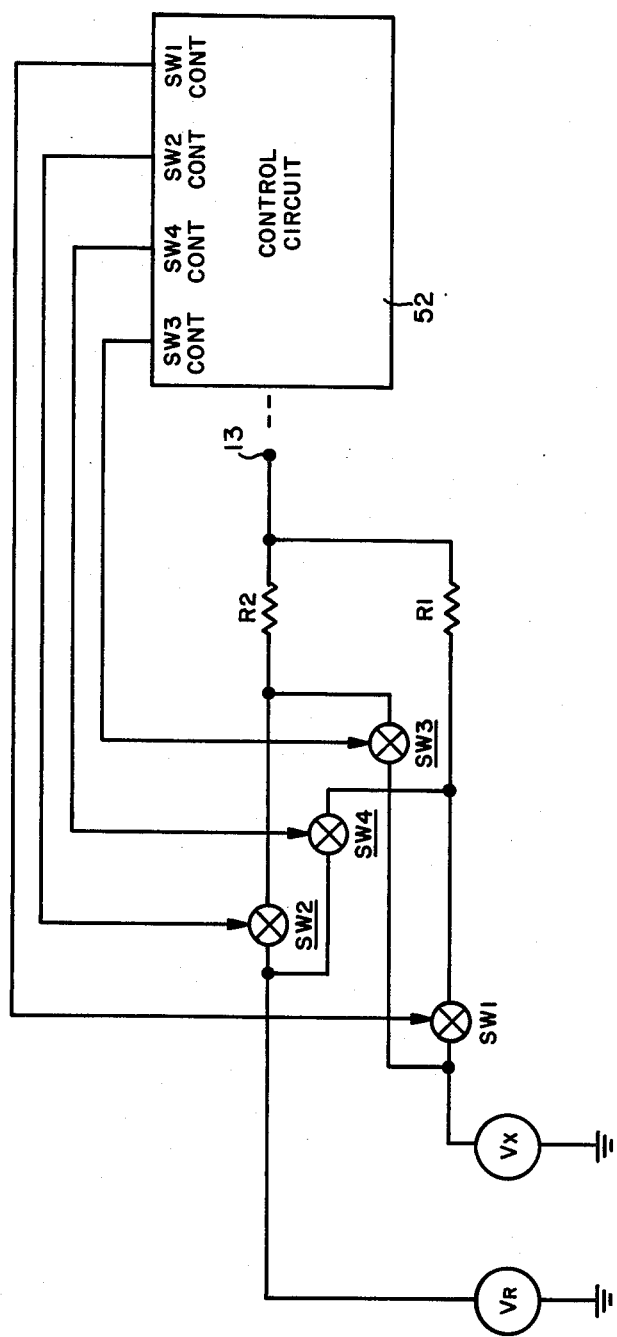
FIG. 3 is a multiplexed arrangement for use with the circuit of FIG. 1.

In the circuit of FIG. 1, $V_X$ is applied via R1 to node 13 and $V_R$ is applied via R2 to node 13. R1 and R2 are matched and are made as nearly identical as is possible. However, where an extremely high degree of accuracy is needed, it is desirable that $V_R$ and $V_X$ be interlaced such that $V_X$ is applied to node 13 via R1 for one half of the time and via R2 for the other half of the time. $V_R$, if need be applied, would then be applied via the other resistor, i.e. the resistor to which $V_X$ is not applied. This may be accomplished by means of two additional switches, SW3 and SW4, controlled by control circuit 52, as shown in FIG. 3. The interlacing of R1 and R2 is readily accomplished by means of circuitry in control circuit 52 and/or by programming the microprocessor 50.

Figure 4:
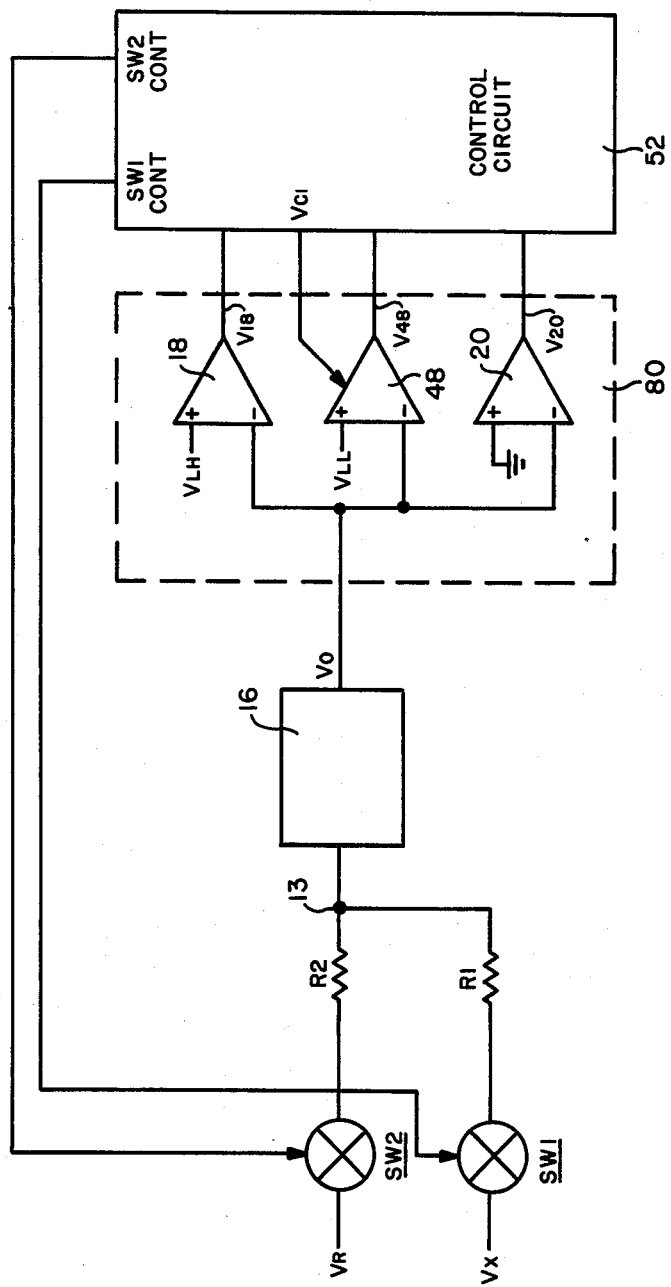
FIG. 4 is a block diagram of another system embodying the invention.

In the circuit of FIG. 1, the reference voltage is applied for a fixed (predetermined) sub-interval of time whenever Vo exceeds a preset level. For proper operation it is important that the integrator output not be ramped down (or up) to the initial threshold level (e.g. zero volts) during the sub-interval. Hence the sub-interval must be selected to have a sufficiently short period to avoid any problem. The use of fixed sub-intervals may be eliminated as shown in FIG. 4 by means of an additional comparator 48 in addition to a comparator 18 of the type described in FIG. 1. For ease of illustration, FIG. 4 shows only the portion of the sensing circuitry 80 needed to sense and control a positively ramping Vo. Negatively ramping Vo could be sensed and controlled by three additional comparators similar to those shown in box 80 and biased to take into account the negative polarity.

The output Vo of integrator 16 is applied to the negative input (−) of comparator 48 and a voltage $V_{LL}$ is applied to its positive input (+). $V_{LL}$ is more positive than zero volts and may be, for example, equal to 1.5 volts.

Assuming that $V_X$ is of a polarity to cause Vo to ramp up during $T_S$, comparator 48 is enabled via a control circuit 52, similar to circuit 52 of FIG. 1, during the integrating period and as Vo is about to be, or is being, ramped down. That is, comparator 48 is designed to sense when Vo reaches the lower limit (i.e. $V_{LL}$) as Vo is being ramped down to zero volts. If, and when, $V_{LL}$ is reached, comparator 48 produces a trigger signal at its output which is applied to control circuit 52. Circuit 52 then causes $V_R$ to be disconnected from the circuit and counter 56 to stop counting with counter 56 storing the accumulated count.

To better explain the operation of the circuit of FIG. 4, assume that a $V_X$ of a polarity to cause Vo to ramp up is applied (i.e. SW1 is closed) at a time to and that it will be applied for a sampling period which lasts until $t = T_S$ (e.g. 100 milliseconds or 2000 counts). Assume, also, as in FIG. 1, that the high limit voltage (i.e. $V_{LH}$) applied to comparator 18 is equal to 9.5 volts and that comparator 18 functions as described in FIG. 1.

At time $t_o$, $V_X$ is applied, Vo ramps up and fixed counter 54 starts to count out the period $T_S$. If, and when, Vo reaches 9.5 volts, comparator 18 produces a first trigger signal to circuit 52. Circuit 52 then: (a) closes switch SW2 applying $V_R$ to the integrator; (b) enables reference counter 56 which starts counting the length of time $V_R$ is applied to the integrator; and (c) generates a signal $V_{CI}$ which activates comparator 48.

The application of $V_R$ tends to cause Vo to ramp down towards zero volts. If, and when, $V_R$ reaches the value of $V_{LL}$ volts, comparator 48 produces a second trigger signal, applied to circuit 52. In response to the second trigger signal circuit 52 then: (a) opens switch SW2 disconnecting $V_R$ from the integrator and allowing only $V_X$ to be applied to the integrator; and (b) stops counter 56 which stores the accumulated count. Vo may then ramp up to $V_{LH}$ again and then again down to $V_{LL}$.

If necessary, the process described above is repeated time and time again during the sampling period $T_S$.

When $T_S$ is reached counter 54 is frozen, switch SW1 is opened removing $V_X$, SW2 is closed applying only $V_R$, counter 56 is enabled and counts the elapsed time from $T_S$ until Vo reaches zero in addition to any previously stored time, while comparators 18 and 48 are deactivated. The integrator output, Vo, ramps down to zero. Comparator 20 senses when Vo reaches zero and then produces a signal $V_Z$ to circuit 52 which then stops counter 56 and causes its contents to be read out via a register, such as register 58 in FIG. 1. The insertion of $V_R$ and the termination of the application of $V_R$ may thus be done automatically, with the length of time $V_R$ is inserted being determined by the values of $V_X$ and $V_R$.

What is claimed is:

1. The combination comprising:
   an integrator having an input, an output, and first and second power terminals for the application thereto of first and second voltages, respectively, the voltage at the output of said integrator being capable of swinging, at most, between said first and second voltages;
   a first input terminal for the application thereto of an input signal;
   a second input terminal for the application thereto of a reference voltage;
   a first resistor connected between said integrator input and a first node;
   a second resistor connected between said integrator input and a second node; and
   controllable means coupled between said first and second input terminals and said first and second nodes for:
   (a) selectively applying an input signal of unknown amplitude to the input of said integrator for a sampling interval of fixed duration ($T_S$), said input signal capable of producing a voltage at the output of said integrator which increases during said interval $T_S$ from a threshold level to a value which could exceed one of said first and second voltages; and
   (b) selectively applying a reference potential of known amplitude and of a polarity opposite to that of said input signal to said integrator input; said controllable means coupling said input signal via said first resistor for one time period, which is approximately one-half of $T_S$, and via said second resistor for another time period, which is approximately one-half of $T_S$; and said controllable means coupling said reference potential via that one of said first and second resistors not being used to couple said input signal;
   means responsive to the amplitude of the voltage at the output of said integrator, for sensing when the voltage at said output reaches a predetermined limit during said sampling interval $T_S$ and then enabling said controllable means for causing the application of said reference potential, simultaneously with the application of said input signal, until said output voltage decreases below said predetermined limit; and
   means for enabling said controllable means following the termination of said sampling interval, for applying said reference potential, until the output of said integrator is restored to said threshold level.

2. The combination as claimed in claim 1 further including means for counting and summing pulses indicating the total time said reference potential is applied to said integrator.

3. The combination as claimed in claim 1 wherein said means for enabling said controllable means for causing the application of said reference potential includes means for applying said reference potential for fixed sub-intervals, of shorter duration than $T_S$, during said sampling interval.

4. The combination as claimed in claim 3 further including means for accumulating and storing the sub-intervals of time the reference voltage is applied to said integrator.

5. The combination as claimed in claim 1, wherein said means responsive to the amplitude of the voltage at the output of said integrator includes a first comparator means for sensing when said integrator output voltage exceeds said predetermined limit and then initiating the application of said reference potential, and also includes a second comparator means for sensing when the output has reached a second limit of lower amplitude than said predetermined limit for terminating the application of said reference potential to said integrator.

6. A dual slope analog-to-digital converter comprising:
   a differential input integrating amplifier having an inverting input, a non-inverting input, and an output;
   a source of analog signal of unknown magnitude to be converted;
   a first impedance means connected between one of said inverting and non-inverting inputs of said integrating amplifier and a first node;
   a second impedance means connected between said one of said inverting and non-inverting inputs of said integrating amplifier and a second node;
   first controllable means for selectively coupling said source of analog signal to said one of said inputs of said differential input integrating amplifier for a fixed integration period $T_S$, said first controllable means including switching means for selectively coupling said source of analog signal to said first node for a given time period which is approximately one-half of $T_S$, and subsequently to said second node for a time period which is also approximately equal to one-half $T_S$;
   a source of reference potential capable of producing a known potential of polarity opposite to that of said analog signal;
   a second controllable means for selectively coupling said source of reference potential to said one of said inputs of said integrating amplifier; said second controllable means for selectively coupling said source of reference potential to said integrating amplifier via that one of said first and second impedance means not being used to couple said input signal;
   means operative during said integration period $T_S$ responsive to the amplitude of the voltage at the output of said integrator for sensing when its output reaches a preset limit and then enabling said second controllable means for applying said source of reference potential, simultaneously with the application of said analog signal, until said integrator output voltage decreases below said preset limit; and
   means for summing the time intervals during which said reference potential is applied to said integrating amplifier.

7. The combination comprising:
   an integrator having an input, an output, and first and second power terminals for the application thereto of first and second voltages, respectively, the voltage at the output of said integrator being capable of swinging, at most, between said first and second voltages;
   controllable means for selectively applying an input signal of unknown amplitude to the intput of said integrator for a sampling interval of fixed duration $(T_S)$, said input signal capable of producing a voltage at the output of said integrator which increases during said interval $T_S$ from a threshold level to a value which exceeds one of said first and second voltages;
   controllable means for applying a reference potential of known amplitude and of a polarity opposite to that of said input signal to said integrator input;
   means responsive to the amplitude of the voltage at the output of said integrator, including a first comparator means for sensing when the voltage at said output reaches and exceeds a predetermined limit during said sampling interval $T_S$ and then enabling said controllable means for causing the application of said reference potential, simultaneously with the application of said input signal, and said means also including a second comparator means for sensing when the output has reached a second limit of lower amplitude than said predetermined level for terminating the application of said reference potential to said integrator; and
   means for enabling said controllable means following the termination of said sampling interval, for applying said reference potential, until the output of said integrator is restored to said threshold level.

8. The combination as claimed in claim 7 further including means for counting and summing pulses indicating the total time said reference potential is applied to said integrator.

9. The combination as claimed in claim 8 further including means for accumulating and storing the sub-intervals of time the reference voltage is applied to said integrator.

10. The combination as claimed in claim 7 wherein said means for selectively applying an input signal includes first switching means for coupling said input signal via a first resistor to said integrator input; and
   wherein said controllable means for applying a reference potential includes second switching means for coupling said reference potential via a second resistor to said integrator input.

* * * * *